United States Patent
Van't Oever

(10) Patent No.: US 7,256,106 B2
(45) Date of Patent: Aug. 14, 2007

(54) METHOD OF DIVIDING A SUBSTRATE INTO A PLURALITY OF INDIVIDUAL CHIP PARTS

(75) Inventor: Ronny Van't Oever, Enschede (NL)

(73) Assignee: Micronit Microfluidics B.V., Enschede (NL)

( * ) Notice: Subject to any disclaimer, the term of this patent is extended or adjusted under 35 U.S.C. 154(b) by 230 days.

(21) Appl. No.: 10/499,292

(22) PCT Filed: Dec. 19, 2002

(86) PCT No.: PCT/NL02/00850

§ 371 (c)(1),
(2), (4) Date: Feb. 4, 2005

(87) PCT Pub. No.: WO03/051765

PCT Pub. Date: Jun. 26, 2003

(65) Prior Publication Data

US 2005/0148158 A1    Jul. 7, 2005

(30) Foreign Application Priority Data

Dec. 19, 2001 (NL) .................................. 1019613

(51) Int. Cl.
*H01L 21/00* (2006.01)
*H01L 21/30* (2006.01)
*H01L 21/46* (2006.01)

(52) U.S. Cl. .................... 438/460; 438/461; 438/462; 438/68; 438/114; 438/458; 257/E21.596; 257/E21.599

(58) Field of Classification Search .............. 438/460, 438/68, 114, 113, 462, 463, 464, 465, 31, 438/461, 458; 257/E21.596, E21.597, E21.598, 257/E21.599

See application file for complete search history.

(56) References Cited

U.S. PATENT DOCUMENTS 3,859,127 A * 1/1975 Lehner
4,325,182 A * 4/1982 Tefft et al. ................... 438/465

(Continued)

FOREIGN PATENT DOCUMENTS

EP    0 514 706 A2    11/1992

(Continued)

OTHER PUBLICATIONS

Int'l Search Report for PCT/NL02/00850, Jul. 25, 2003.

*Primary Examiner*—Walter Lindsay, Jr.
(74) *Attorney, Agent, or Firm*—Fliesler Meyer LLP

(57) ABSTRACT

The present invention relates to a method for dividing a substrate into a number of individual chip parts, comprising the steps of: forming a number of chip parts in the substrate, comprising, for each chip part, of arranging recesses in the substrate for containing fluid; arranging one or more breaking grooves in the substrate along individual chip parts; applying mechanical force to the substrate to break the substrate along the breaking grooves. The invention also relates to a substrate as well as a chip part.

35 Claims, 2 Drawing Sheets

U.S. PATENT DOCUMENTS

| | | | |
|---|---|---|---|
| 4,999,684 A * | 3/1991 | Temple | |
| 5,684,324 A * | 11/1997 | Bernstein | 257/415 |
| 6,351,134 B2 * | 2/2002 | Leas et al. | |
| 6,518,101 B1 * | 2/2003 | Spitz et al. | |
| 6,629,425 B2 * | 10/2003 | Vaiyapuri | |
| 7,107,777 B2 * | 9/2006 | Vaiyapuri et al. | |
| 7,183,136 B2 * | 2/2007 | Hashimura et al. | |
| 2003/0082587 A1 * | 5/2003 | Seul et al. | |
| 2003/0164295 A1 * | 9/2003 | Sterling | |
| 2004/0013378 A1 * | 1/2004 | Lee et al. | |
| 2006/0223234 A1 * | 10/2006 | Terayama et al. | |
| 2007/0004175 A1 * | 1/2007 | Harris, Jr. | |
| 2007/0077732 A1 * | 4/2007 | Ito et al. | |

FOREIGN PATENT DOCUMENTS

| | | |
|---|---|---|
| EP | 0 678 387 A | 10/1995 |
| JP | 58130528 | 8/1983 |
| JP | 58098983 | 6/1996 |
| WO | WO 03/051765 A2 | 6/2003 |

* cited by examiner

METHOD OF DIVIDING A SUBSTRATE INTO A PLURALITY OF INDIVIDUAL CHIP PARTS

The present invention relates to a method for dividing a substrate into a number of individual chip parts. The invention also relates to a substrate on which is arranged a number of chip parts for dividing. The invention likewise relates to a chip part separated from a substrate.

So-called fluidic chips have been developed in the recent past, wherein a fluid with charged particles is transported through a microstructure, such as for instance formed by very small channels, arranged in the chip part by applying an electric field, under the influence of which the positively and negatively charged particles displace in opposite directions. This transporting mechanism is also known as electrophoresis. Fluidic chips have also been designed in which the transporting mechanism of the fluid is so-called electro-osmosis. The channels in the chip part are in this case enclosed by an electrical insulator, wherein transport of the fluid in the channels can be controlled using electrodes. The fluid in the channels can also be displaced via an externally applied (hydraulic) pressure. Fluidic chips are also known which function as micro-reactor in which chemical reactions are initiated on micro-scale.

It can be deemed known to produce these fluidic chips relatively inexpensively in large numbers by manufacturing a number of these chips (for instance 10) simultaneously on a larger substrate. The individual chips or chip parts ("chip dices") are then mutually separated, before they are finished one by one, optionally in automated manner, with electrical and other connections to the outside and packaged in a protective housing.

It can be deemed known to mutually separate the chip parts by sawing the substrate into sections. Another known method is cutting the substrate with a laser beam ("laser scribing"). The known manufacturing methods have the drawback that special and expensive equipment is required, which moreover can only simultaneously realize one sawing line respectively cutting line or only a number of parallel sawing lines respectively cutting lines, and this for only one substrate at a time. An accurate and time-consuming aligning procedure must also be followed in order to arrange the sawing lines respectively cutting lines at exactly the correct positions relative to the microstructures in the chip parts. A further drawback is that during the sawing or cutting a quantity of dust and/or a quantity of fluid is released, which can collect in the microstructures of the chip parts, such as for instance in the channels, feed openings and so on.

Known from American patent specification U.S. Pat. No. 6,075,280 is a method for separating a number of integrated circuits (IC) chips. This does not however relate to a substrate for holding a fluid or gas as described above, but a semiconductor substrate, furthermore of a special crystallographic orientation, on which are provided integrated circuits of the electronic type. In addition, the known method is complicated and comprises a large number of processing steps. The known method consists of the following processing steps being performed: arranging a layer of a material which is resistant to concentrated potassium hydroxide solutions, for instance a silicon oxide layer, forming a photoresist layer, treating the photoresist layer via a photolithographic process, wherein the patterns for exposing in this layer have to be oriented very precisely in accordance with the crystallographic directions in the substrate, as well as performing a crystal direction-dependent etching process in the substrate, for instance in a concentrated potassium hydroxide solution, for the purpose of arranging V-shaped breaking grooves. The grooves are oriented along the crystal directions, which crystal directions also form the breaking directions of the semiconductor substrate. The above described process is complicated and furthermore requires a number of additional processing steps, which makes manufacture of the chips time-consuming and costly. The most important shortcoming of the method however is the limited applicability, since only monocrystalline substrates of determined, suitably chosen crystallographic cut can be divided in this manner.

It is an object of the present invention to provide a method for dividing a substrate into a number of different chip parts, wherein the above stated drawbacks are obviated.

It is a further object of the invention to provide a method for dividing the chip parts in which an additional aligning step can be omitted.

According to a first aspect of the invention there is provided a method for dividing a substrate into a number of individual chip parts, comprising the steps of:

forming a number of chip parts in the substrate, comprising, for each chip part, of arranging recesses in the substrate for containing fluid;

arranging one or more breaking grooves in the substrate along individual chip parts;

applying mechanical force to the substrate to break the substrate along the breaking grooves, wherein the steps of arranging recesses in the substrate and arranging breaking grooves in the substrate are performed substantially simultaneously. Dividing the substrate into the different chip parts in such a manner avoids dust and/or fluid entering the recesses for containing fluid in the chip parts, as is the case when the chip parts are sawn or cut. Furthermore, the chance of losing substrate material, particularly at the edges of the substrate, and the chance of damage such as cracking in the substrate, is further reduced. The steps of arranging recesses in the substrate and arranging breaking grooves in the substrate are performed substantially simultaneously and preferably in one step. This results in a decrease in the number of processing steps.

The substrate preferably comprises at least a first and a second substrate part, and the method comprises the steps of:

a) arranging in the first substrate part at least one recess for containing fluid;

b) arranging in the second substrate part passages to the recess in the first substrate part, wherein a first passage forms a fluid feed and a second passage forms a fluid discharge;

c) arranging one or more breaking grooves in at least one of the substrate parts;

d) placing the second substrate part on the first substrate part;

e) breaking the substrate along the breaking grooves. The steps of arranging recesses in a substrate part and arranging breaking grooves in one or more of the substrate parts are once again performed here substantially simultaneously and preferably in one step.

The sequence of steps a-d can herein otherwise be changed. The step of placing the second substrate on the first substrate can thus also be carried out immediately after the first step, although when carried out in this order there is the risk that during arranging of the breaking grooves contaminants may enter the channels, such as for instance powder from a powder blast process, which is undesirable. By making use of two substrate parts for placing one on the other, it is relatively simple to arrange the desired channel structure, since the recesses in the first substrate form channels once the second substrate has been placed on the first substrate. Depending on the desired microstructure in the chip, embodiments can otherwise also be envisaged with three or more substrates placed one on top of another. In the first substrate or the second substrate breaking grooves are arranged along the chip parts for dividing. Because the substrates are fixed one on top of another, it will suffice to arrange breaking grooves in just one of the substrates. Breaking grooves can however also be arranged in more of the substrates.

For the purpose of arranging the recesses and/or the breaking grooves, the method preferably comprises of removing substrate material by a powder blast process. Powder, for instance aluminium oxide particles with a diameter of an average of 30 micrometre, is herein blasted against the substrate material at high speed, as a result of which substrate material is removed locally.

The method according to the invention further preferably comprises of arranging a lithographic mask on the substrate. This can then be followed by removing substrate material at positions designated by the mask, preferably by means of the above stated powder blast process.

The breaking grooves preferably have a depth which corresponds with the thickness of the substrate or the substrate packet, wherein the substrate packet comprises two or more substrate parts placed one on the other.

Another aspect of the present invention relates to a substrate on which a number of chip parts are arranged, wherein a chip part comprises a number of first relatively deep recesses, preferably channel structures for transporting fluid, as well as at least one feed opening and at least one discharge opening for feeding respectively discharging fluid, in addition to one or more second relatively shallow recesses which form breaking grooves extending along the individual chip parts, wherein the breaking grooves are provided for the purpose of dividing the individual chip parts from each other through breaking.

The recesses are preferably arranged using the above mentioned powder blast process. The recesses thus formed in the substrate have a substantially rounded V-shape in cross-section. Particularly when compared to for instance round or rectangular breaking grooves, the V-shape of the breaking grooves is advantageous since the V-shape simplifies breaking of the substrate.

In a specific preferred embodiment the substrate is provided with a protective layer which is treated lithographically at the position of the chip parts. The protective layer is removed locally at positions defined by the lithographic mask. This enables recesses to be made in the substrate in accurate and simple manner in those areas where the protective layer has been removed, using the above stated powder blast technique. The same lithographic mask is used in this embodiment not only to manufacture the chip parts, i.e. arrange the microstructures of the chip parts, but also to arrange the breaking grooves. This means that a separate aligning step for the purpose of arranging the breaking grooves can be dispensed with.

When the powder blast technique is used, the depth of a recess depends on the width of the opening in the lithographically treated protective layer. Through a correct choice of the lithographic mask, a desired depth of the recess is thus "automatically" realized. A rather shallow yet well-defined narrow breaking groove can thus be arranged simultaneously with deeper structures for fluidic uses, such as inlets and outlets and channels for chemical separation techniques or chemical synthesis.

According to a further aspect of the invention, a chip part is provided which is separated from a substrate, wherein the chip part comprises a substrate in which is arranged a number of recesses for containing fluid, which recesses preferably form channel structures for transporting fluid as well as at least one feed opening and at least one discharge opening for feeding respectively discharging fluid, wherein the peripheral surface of the substrate comprises a chamfered edge corresponding with a breaking groove arranged in the upper surface of the substrate and a surface extending under the chamfered edge and defined by breaking of the substrate along the breaking groove. The chip part divided according to the above stated method according to the invention is recognizable from the outside, among other reasons, because the peripheral surface thereof has a part with a determined roughness which is indicative of the breaking of the substrate, as well as a part with a different roughness which is moreover slightly chamfered, which part is indicative of a breaking groove arranged in the substrate.

The substrate of a chip part is preferably manufactured from relatively hard material such as preferably glass. Glass is a relatively hard material in which (capillary) channel structures and the like can be readily arranged. In another preferred embodiment with two or more substrates, a number of the substrates is manufactured from glass and the remaining number of substrates is manufactured from plastic, for instance as support for the glass substrates.

An as yet unmentioned advantage of the present invention is that, as a consequence of breaking the chip parts out of a substrate, there results a minimal loss of chip surface, this in contrast to the loss of typically 300 micrometre on all sides of a chip part in order to divide the chips according to the above stated standard methods.

Further advantages, features and details of the present invention will be elucidated on the basis of a description of two preferred embodiments thereof. In the description reference is made to the figures, in which.

Figure 1:
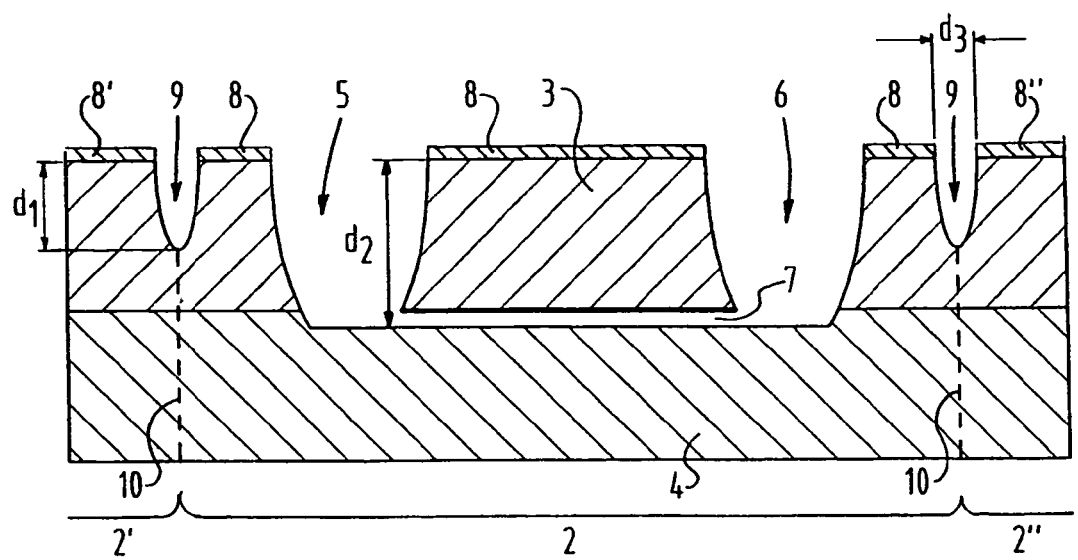
FIG. 1 shows a cross-section of a substrate in which a number of micro-fluidic chips is provided.
Figure 2:
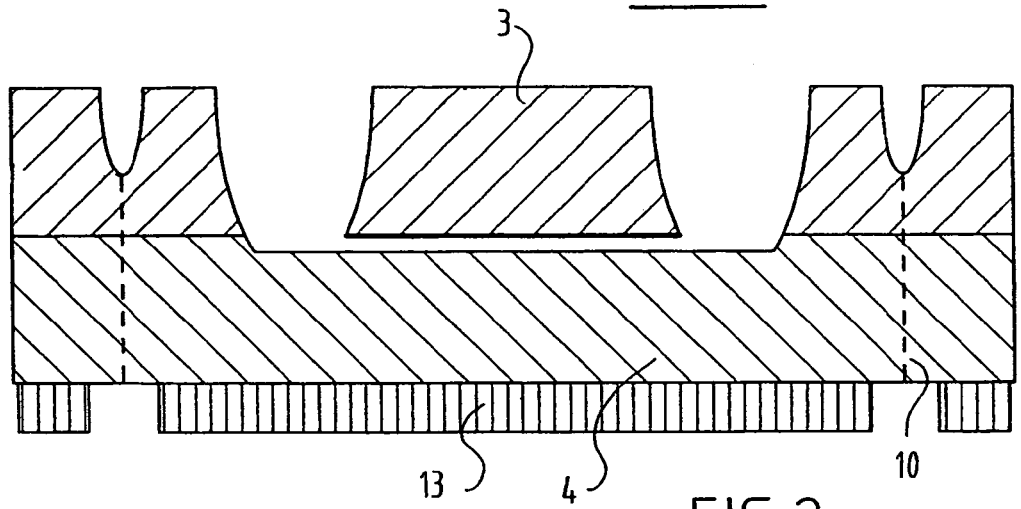
FIG. 2 shows a cross-section of another preferred embodiment with two substrates placed one on the other.
Figure 3:
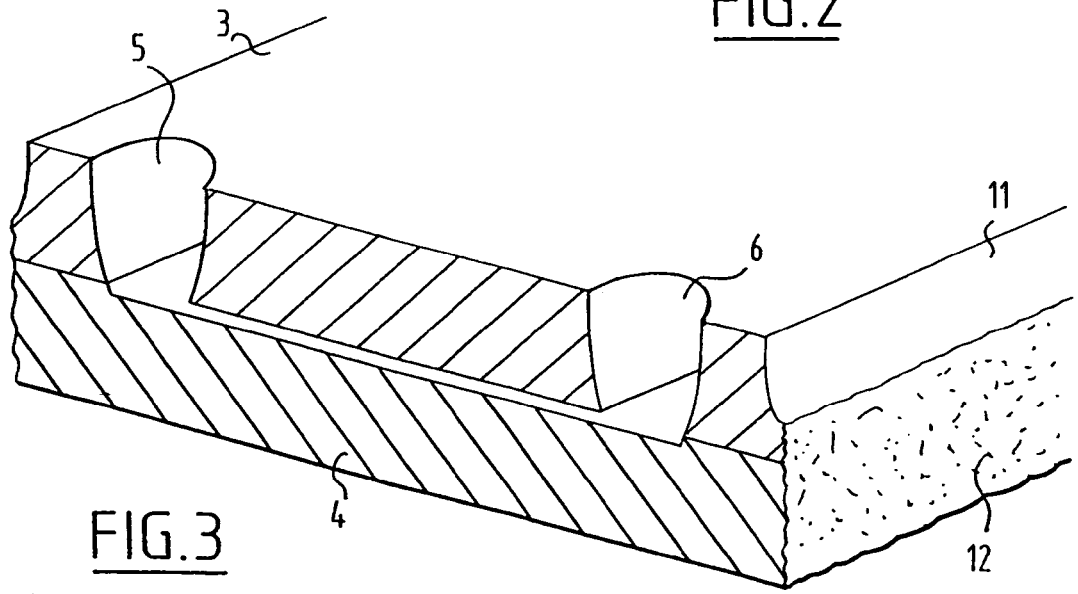
FIG. 3 shows a partly cut-away perspective view of a chip part separated along a side of the substrate.

FIGS. 1-3 show the processing steps with which a substrate can be divided into a number of individual chip parts or micro-fluidic chips. As shown in FIG. 1, a substrate comprises a number of chips (chip parts), for instance ten, 2, 2', 2" which are arranged simultaneously. In the shown embodiment the substrate is built up of two substrates, namely an upper substrate 3 and a lower substrate 4. A recess 7 is arranged in lower substrate 4 using an etching technique, a laser machining technique or a powder blast technique. In assembled state, when the two substrates are fixed to each other, the recess forms a channel. Recesses 5 and 6 are made in upper substrate 3. In assembled state these function as passages, wherein the first passage 5 is a feed opening for the channel formed by recess 7, while passage 6 forms a discharge for said channel. The upper substrate 3 is moreover provided in known manner with a thin protective layer 8.

The term "channels" is otherwise understood to mean both "open" and "closed" structures. This means that a deep groove arranged in a substrate and open at the top forms a channel, but that a (tubular) passage arranged in a substrate also forms a channel.

The substrates are fixed to each other via for instance a technique known in the field as direct bonding.

After the different chip parts 2,2',2" have been manufactured on the substrate, they have to be mutually separated. The separation of the different chip parts takes place as follows.

Simultaneously with arranging of passages 5 and 6 in upper substrate 3, relatively shallow breaking grooves 9 are arranged along chip parts 2, 2', 2". Breaking grooves 9 are arranged simultaneously with arranging of passages 5 and 6 in the upper substrate, preferably via a masked powder blasting method, wherein the substrate material is blasted away by a powder jet in a pattern defined by a mask. This masked powder blast process has the characteristic that the depth of the structure arranged in the substrate, for instance the depth $d_1$ of breaking groove 9, depends on the width of the opening, in the case of breaking groove 9 equal to width $d_3$ of the opening in the lithographically treated protective layer 8. A relatively narrow breaking groove can hereby be manufactured, characteristically in the order of magnitude of $d_3$=100 micrometre or less. This means a minimal loss on the chip surface compared to standard techniques, such as the above stated sawing method or the laser scribing technique. This moreover has the advantage that no fluid or sawdust enters the chip, as is often the case in above stated techniques. During use of the fluidic chips, dust or fluid can for instance collect in the microstructures such as the channels 7 or passages 5 and 6, which disrupts the operation of the device. Furthermore, such dust or fluid is generally very difficult to remove, with the result that the fluidic chip is useless.

Figure 4:
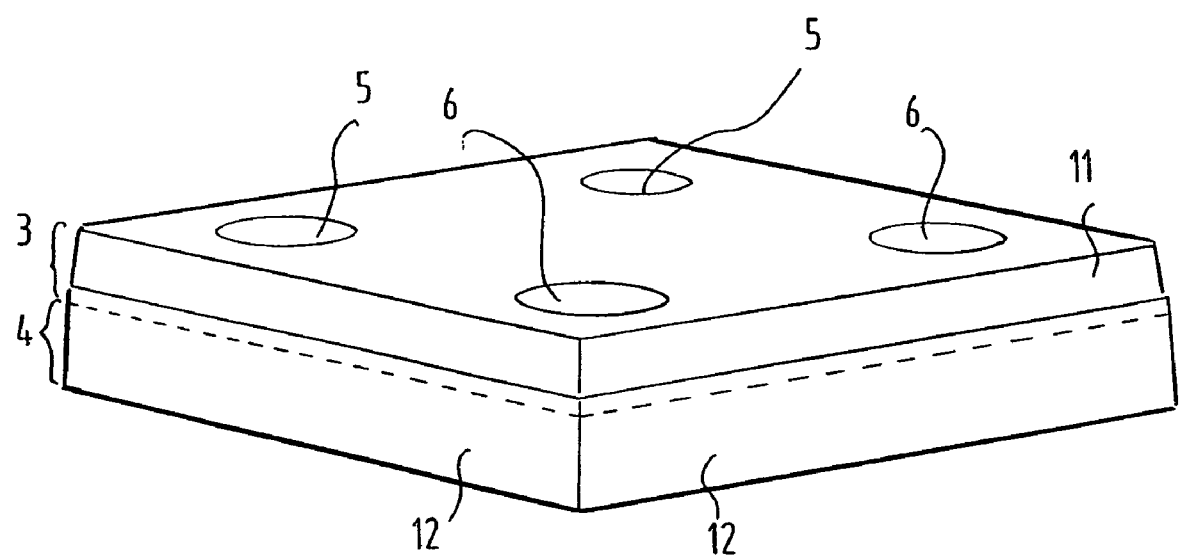
FIG. 4 shows a perspective view of a chip part separated from a substrate.

After the breaking grooves 9 have been arranged over sufficient depth $d_1$=500 micrometre in upper substrate 3, the different chip parts 2, 2', 2" can be easily broken along a plane designated with a dotted line 10 by applying mechanical force, for instance manual force. FIG. 3 and FIG. 4 show a thus separated chip part 2. It can be clearly seen that a breaking groove is arranged through a depth $d_1$ on the upper side 11 of upper substrate 3, this being shown by the relatively smooth structure of the substrate material, while the remaining part 12 of the peripheral surface of the substrate (2,3) has been broken off and therefore has a relatively irregular structure. The interface between upper substrate 3 and lower substrate 4 is indicated in FIG. 4 with a dotted line. This interface is usually (hardly) visible in practice.

FIG. 2 shows an alternative preferred embodiment in which the second substrate 4 is arranged on a carrier 13, for instance manufactured from plastic. A further embodiment (not shown) has a single substrate instead of an upper and a lower substrate 3 and 4, wherein the single substrate is also arranged on a carrier 13. At the position of the breaking planes 10 the carrier 13 is interrupted in order to allow chip parts 2, 2', 2" to be broken off.

The present invention is not limited to the described embodiments thereof; the rights sought are defined by the following claims, within the scope of which many modifications can be envisaged.

The invention claimed is:

1. A method for dividing a substrate into a number of individual chip parts, comprising the steps of:
    forming a number of chip parts in the substrate, comprising, for each chip part, recesses in the substrate for containing fluid;
    arranging one or more breaking grooves in the substrate along individual chip parts;
    applying mechanical force to the substrate to break the substrate along the breaking grooves;
    wherein the steps of arranging recesses in the substrate and arranging breaking grooves in the substrate are performed substantially simultaneously, wherein the substrate comprises a first and a second substrate part, and the method further comprises the steps of:
    a) arranging in the first substrate part at least one recess for containing fluid;
    b) arranging in the second substrate part passages to the recess in the first substrate part, wherein a first passage forms a fluid feed and a second passage forms a fluid discharge;
    c) arranging one or more breaking grooves in at least one of the substrate parts;
    d) placing the second substrate part on the first substrate part;
    e) breaking the substrate along the breaking grooves.

2. The method as claimed in claim 1, wherein step (d) is performed before step (b).

3. A method for dividing a substrate into a number of individual chip parts, comprising the steps of:
    forming a number of chip parts in the substrate, comprising, for each chip part, recesses in the substrate for containing fluid;
    arranging one or more breaking grooves in the substrate along individual chip parts;
    applying mechanical force to the substrate to break the substrate along the breaking grooves;
    removing substrate material by a powder blast process;
    wherein the steps of arranging recesses in the substrate and arranging breaking grooves in the substrate are performed substantially simultaneously.

4. The method as claimed in claim 3, comprising arranging a lithographic mask on the substrate, followed by removing substrate material at positions designated by the mask.

5. The method as claimed in claim 3, wherein the arranging of recesses in the substrate comprises arranging a lithographic mask on the substrate, followed by the powder blast process for removing substrate material.

6. The method as claimed in claim 1, wherein the arranging of recesses in the first substrate part comprises arranging a lithographic mask on the first substrate part, followed by a powder blast process for removing substrate material at positions designated by the mask.

7. A method for dividing a substrate into a number of individual chip parts, comprising the steps of:
    forming a number of chip parts in the substrate, comprising, for each chip part, recesses in the substrate for containing fluid;
    arranging one or more breaking grooves in the substrate along individual chip parts, and transport means in the recess for transporting the fluid in the recesses;
    applying mechanical force to the substrate to break the substrate along the breaking grooves;
    wherein the steps of arranging recesses in the substrate and arranging breaking grooves in the substrate are performed substantially simultaneously.

8. The method as claimed in claim 7, wherein the transport means include recesses which comprise channel structures for transporting fluid and/or at least one feed opening and at least one discharge opening for feeding respectively discharging fluid.

9. The method as claimed in claim 7, comprising arranging a cathode and an anode in the substrate for applying an electric field in the recess with which fluid particles can be transported in the recess by electrophoresis.

10. The method as claimed in claim 7, comprising providing the recess at least partially with an insulator with which the fluid particles can be transported in the recess by electro-osmosis.

11. A method for dividing a substrate into a number of individual chip parts, comprising the steps of:
forming a number of chip parts in the substrate, comprising, for each chip part, recesses in the substrate for containing fluid;
arranging one or more breaking grooves in the substrate along individual chip parts, wherein the breaking grooves have a depth which corresponds with the thickness of the substrate or the substrate packet;
applying mechanical force to the substrate to break the substrate along the breaking grooves;
wherein the steps of arranging recesses in the substrate and arranging breaking grooves in the substrate are performed substantially simultaneously.

12. The method as claimed in claim 1, wherein the breaking groove has a depth which corresponds with the thickness of only one of the substrate parts.

13. The method as claimed in claim 4, comprising removing a protective layer arranged on the chip parts at the positions designated by the lithographic mask.

14. A substrate on which a number of chip parts are arranged, wherein a chip part comprises a number of first relatively deep recesses, preferably channel structures for transporting fluid, as well as at least one feed opening and at least one discharge opening for feeding respectively discharging fluid, and comprises one or more second relatively shallow recesses which form breaking grooves extending along the individual chip parts, wherein the breaking grooves are provided for the purpose of dividing the individual chip parts from each other through breaking.

15. The substrate as claimed in claim 14, wherein the recesses are arranged with a powder blast process.

16. The substrate as claimed in claim 15, wherein the recesses have a substantially rounded V-shape in cross-section.

17. The substrate as claimed in claim 14, wherein a protective layer is provided on the chip parts which is treated lithographically for removing the protective layer locally at positions defined by a lithographic mask.

18. The substrate as claimed in claim 17, wherein the depth of a recess depends on the width of the opening in the lithographically treated protective layer.

19. A chip part separated from a substrate, comprising a substrate in which is arranged a number of recesses for containing fluid, which recesses preferably form channel structures for transporting fluid as well as at least one feed opening and at least one discharge opening for feeding respectively discharging fluid, wherein the peripheral surface of the substrate comprises a chamfered edge corresponding with a breaking groove arranged in the upper surface of the substrate and a surface extending under the chamfered edge and defined by breaking of the substrate along the breaking groove.

20. The chip part as claimed in claim 19, wherein the edge has a determined roughness indicative of the breaking groove which differs from the roughness of the surface defined by breaking of the substrate.

21. The chip part as claimed in claim 19, wherein the substrate comprises a first substrate and a second substrate fixed thereto, wherein at least one recess for guiding fluid is arranged in the first substrate and passages to the recess in the first substrate are arranged in the second substrate, wherein a first passage forms a fluid feed and a second passage forms a fluid discharge.

22. The chip part as claimed in claim 19, wherein the substrate is manufactured from relatively hard material.

23. The chip part as claimed in claim 19, wherein the substrate is manufactured from ceramic material.

24. The chip part as claimed in claim 19, wherein the substrate is manufactured from glass.

25. The chip part as claimed in claim 21, wherein the first substrate is manufactured from plastic and the second substrate is manufactured from glass.

26. The chip part as claimed in claim 19, wherein the substrate is a crystalline material and the breaking grooves are arranged in the wafer substrate independently of crystal direction.

27. The chip part as claimed in claim 19, wherein the breaking groove width is in the order of magnitude of 200 micrometers or less.

28. The chip part as claimed in claim 19, wherein the breaking groove depth amounts to about 500 micrometers.

29. The chip part as claimed in claim 19, wherein the channel structures form capillaries.

30. The chip part as claimed in claim 19 which forms micro-fluidic chips.

31. The chip part as claimed in claim 19, further comprising means for generating a fluid flow through the recesses in the substrate by electrophoresis and/or electro-osmosis.

32. The chip part as claimed in claim 19, further comprising a micro-reactor.

33. A method for manufacturing a chip part separated from a substrate, comprising a substrate in which is arranged a number of recesses for containing fluid, which recesses preferably form channel structures for transporting fluid as well as at least one feed opening and at least one discharge opening for feeding respectively discharging fluid, wherein the peripheral surface of the substrate comprises a chamfered edge corresponding with a breaking groove arranged in the upper surface of the substrate and a surface extending under the chamfered edge and defined by breaking of the substrate along the breaking groove.

34. A chip part separated from a substrate on which a number of chip parts are arranged, wherein a chip part comprises a number of first relatively deep recesses, preferably channel structures for transporting fluid, as well as at least one feed opening and at least one discharge opening for feeding respectively discharging fluid, and comprises one or more second relatively shallow recesses which form breaking grooves extending along the individual chip parts, wherein the breaking grooves are provided for the purpose of dividing the individual chip parts from each other through breaking, the chip part comprising a substrate in which is arranged a number of recesses for containing fluid, which recesses preferably form channel structures for transporting fluid as well as at least one feed opening and at least one discharge opening for feeding respectively discharging fluid, wherein the peripheral surface of the substrate comprises a chamfered edge corresponding with a breaking groove arranged in the upper surface of the substrate and a surface extending under the chamfered edge and defined by breaking of the substrate along the breaking groove.

35. A method for manufacturing a substrate on which a number of chip parts are arranged, wherein a chip part comprises a number of first relatively deep recesses, preferably channel structures for transporting fluid, as well as at least one feed opening and at least one discharge opening for feeding respectively discharging fluid, and comprises one or more second relatively shallow recesses which form breaking grooves extending along the individual chip parts, wherein the breaking grooves are provided for the purpose of dividing the individual chip parts from each other through breaking.

* * * * *